US010068888B2

(12) United States Patent
Zhang et al.

(10) Patent No.: US 10,068,888 B2
(45) Date of Patent: Sep. 4, 2018

(54) MAKING SEMICONDUCTOR DEVICES WITH ALIGNMENT BONDING AND SUBSTRATE REMOVAL

(71) Applicant: Hong Kong Beida Jade Bird Display Limited, Hong Kong (CN)

(72) Inventors: Lei Zhang, Albuquerque, NM (US); Fang Ou, Monterey Park, CA (US); Qiming Li, Albuquerque, NM (US)

(73) Assignee: Hong Kong Beida Jade Bird Display Limited, Hong Kong (CN)

( * ) Notice: Subject to any disclaimer, the term of this patent is extended or adjusted under 35 U.S.C. 154(b) by 30 days.

(21) Appl. No.: 15/269,954

(22) Filed: Sep. 19, 2016

(65) Prior Publication Data

US 2017/0179097 A1    Jun. 22, 2017

Related U.S. Application Data

(60) Provisional application No. 62/270,376, filed on Dec. 21, 2015.

(51) Int. Cl.
| | |
|---|---|
| *H01L 21/00* | (2006.01) |
| *H01L 25/00* | (2006.01) |
| *H01L 27/15* | (2006.01) |
| *H01L 25/16* | (2006.01) |
| *H01L 27/12* | (2006.01) |

(52) U.S. Cl.
CPC ............ *H01L 25/50* (2013.01); *H01L 25/167* (2013.01); *H01L 27/124* (2013.01); *H01L 27/1262* (2013.01); *H01L 27/156* (2013.01)

(58) Field of Classification Search
CPC ..... H01L 25/50; H01L 27/156; H01L 25/167; H01L 27/1262; H01L 27/124; H01L 25/00; H01L 25/16; H01L 27/12; H01L 27/15
See application file for complete search history.

(56) References Cited

U.S. PATENT DOCUMENTS

| | | | |
|---|---|---|---|
| 7,871,052 B2 | 1/2011 | Baum | |
| 8,642,363 B2 | 2/2014 | Lau et al. | |
| 2003/0058210 A1 | 3/2003 | Yamazaki et al. | |
| 2011/0297975 A1 | 12/2011 | Yeh et al. | |
| 2011/0299044 A1* | 12/2011 | Yeh ......................... | H04N 9/315 353/52 |
| 2012/0223875 A1 | 9/2012 | Lau et al. | |
| 2014/0008667 A1 | 1/2014 | Lau et al. | |
| 2015/0371585 A1* | 12/2015 | Bower ..................... | G09G 3/32 345/1.1 |

OTHER PUBLICATIONS

PCT International Search Report and Written Opinion, PCT Application No. PCT/US16/67789, dated Mar. 10, 2017, 12 pages.

* cited by examiner

*Primary Examiner* — Charles Garber
*Assistant Examiner* — Abdulfattah Mustapha
(74) *Attorney, Agent, or Firm* — Fenwick & West LLP

(57) ABSTRACT

Embodiments include a manufacturing method of making a semiconductor device via multiple stages of alignment bonding and substrate removal. One example is an integrated full-color LED display panel, in which multiple wafers with different arrays of LEDs are integrated onto a host wafer with driver circuitry. The driver circuitry typically is an array of pixel drivers that drive individual LEDs on the display panel.

16 Claims, 18 Drawing Sheets

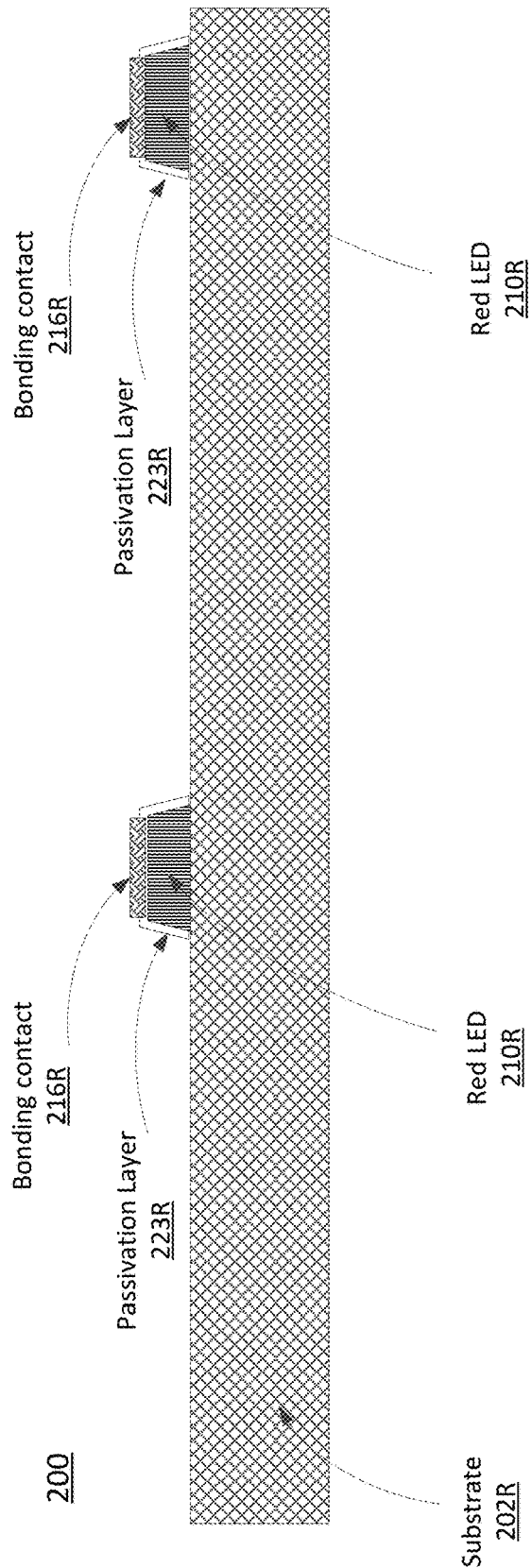

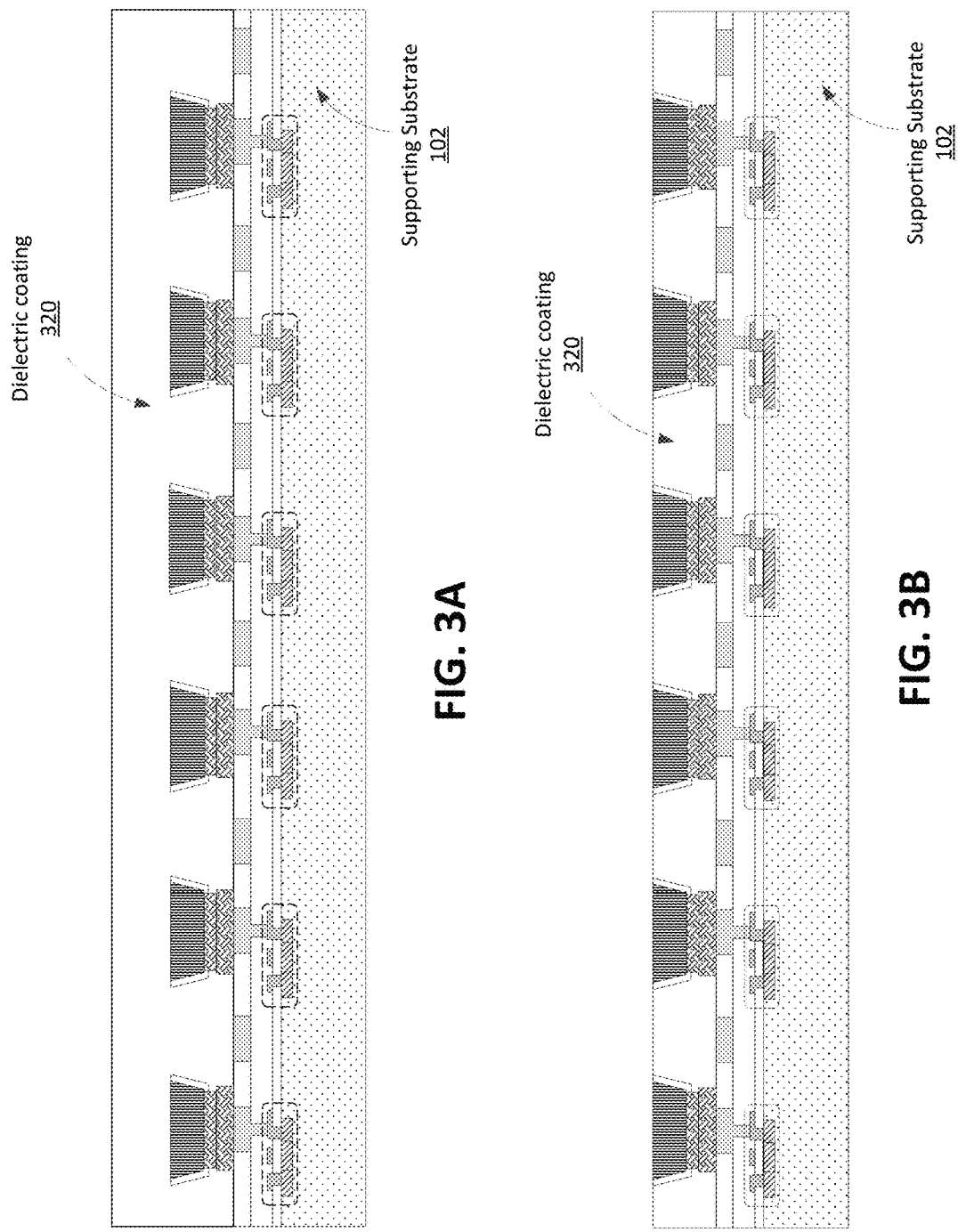

MAKING SEMICONDUCTOR DEVICES WITH ALIGNMENT BONDING AND SUBSTRATE REMOVAL

CROSS-REFERENCE TO RELATED APPLICATION(S)

This application claims priority under 35 U.S.C. § 119(e) to U.S. Provisional Patent Application Ser. No. 62/270,376, entitled "Method of Making RGB LED Micro-Display by Multiple Alignment Bonding and Substrate Removal Process," filed on Dec. 21, 2015. The subject matter of all of the foregoing is incorporated herein by reference in their entirety.

BACKGROUND

1. Field of the Invention

This disclosure relates generally to methods for fabricating semiconductor devices, for example, methods for fabricating integrated multi-color LED display panels.

2. Description of Related Art

Active matrix liquid-crystal displays (LCD) and organic light emitting diode (OLED) displays combined with thin-film transistor (TFT) technology are becoming increasingly popular in today's commercial electronic devices. These displays are widely used in laptop personal computers, smartphones and personal digital assistants. Millions of pixels together create an image on a display. The TFTs act as switches to individually turn each pixel on and off, rendering the pixel light or dark, which allows for convenient and efficient control of each pixel and of the entire display.

However, conventional LCD displays suffer from low light efficiency, causing high power consumption and limited battery operation time. While active-matrix organic light-emitting diode (AMOLED) display panels generally consume less power than LCD panels, an AMOLED display panel can still be the dominant power consumer in battery-operated devices. To extend battery life, it is desirable to reduce the power consumption of the display panel.

Conventional inorganic semiconductor light emitting diodes (LED) have demonstrated superior light efficiency, which makes active matrix LED displays more desirable for battery operated electronics. Arrays of driver circuitry and lighting-emitting diodes (LEDs) are used to control millions of pixels, rendering images on the display. Both single-color display panels and full-color display panels can be manufactured according to a variety of fabrication methods.

However, the integration of thousands or even millions of micro LEDs with pixel driver circuit array is quite challenging. Various fabrication methods have been proposed. In one approach, control circuitry is fabricated on one substrate and LEDs are fabricated on a separate substrate. The LEDs are transferred to an intermediate substrate and the original substrate is removed. Then the LEDs on the intermediate substrate are picked and placed one or a few at a time onto the substrate with the control circuitry. However, this fabrication process is inefficient and costly. In addition, there are no existing manufacturing tools for mass transferring micro LEDs. Therefore new tools must be developed.

In another approach, the entire LED array with its original substrate is aligned and bonded to the control circuitry using metal bonding. The substrate on which the LEDs are fabricated remains in the final product, which may cause light cross-talk. Additionally, the thermal mismatch between the two different substrates generates stress at the bonding interface, which can cause reliability issues. Furthermore, multi-color display panels typically require more LEDs and different color LEDs grown on different substrate materials, compared with single-color display panels, thus making the traditional manufacturing process even more complicated and inefficient.

As a result, there is a need for better manufacturing methods.

SUMMARY

The present disclosure overcomes the limitations of the prior art by using multiple stages of alignment bonding and substrate removal. In the alignment bonding step, two wafers are precisely aligned (e.g., typically to a misalignment of less than 3 µm) and then bonded. In the substrate removal step, the substrate for one of the wafers is removed.

One example is an integrated multi-color LED display panel, in which arrays of LEDs are integrated with corresponding driver circuitry. The driver circuitry typically is an array of pixel drivers that drive the LEDs on the display panel. In one approach, driver circuitry which includes an array of pixel drivers is fabricated on a supporting substrate. For example, these may be CMOS pixel drivers fabricated on a silicon substrate, and this wafer will be referred to as the host wafer. LED wafers are separately fabricated. Each LED wafer includes an array of LEDs fabricated on a substrate. There are multiple LED wafers, for example different wafers for different color LEDs.

A multi-stage alignment bonding and substrate removal process is used to transfer the LEDs to the host wafer with the pixel drivers. One of the LED wafers is bonded to the host wafer, for example by bonding LED contacts to contacts for corresponding pixel drivers on the host wafer. The substrate of the LED wafer is then removed to allow the next LED wafer to be bonded. The substrate of the last LED wafer may or may not be removed. Preferably, all the LEDs of one color (i.e., from one wafer) are bonded to the corresponding pixel drivers in a single alignment bonding. In this way, an integrated single-color LED display panel can be formed using only a single-stage alignment bonding; and a three-color LED display (e.g., using red, blue, green LEDs) can be formed using three stages of alignment bonding, one for each color.

In additional to an integrated LED display panel where LED wafers are bonded to wafers with driver circuitry, the multi-stage alignment bonding and substrate removal process can be applied to other types of devices. For example, a common scenario is the integration of active devices with corresponding control circuits. Examples of active devices include vertical cavity surface emitting lasers (VCSEL), distributed feedback lasers (DFB), silicon photonic devices, micro-electro-mechanical system (MEMS) devices, photo-detectors and power electronic devices. Examples of control circuits include current drivers, voltage drivers, transimpedence amplifiers, and logic circuits.

Other aspects include components, devices, systems, improvements, methods, processes, applications, computer readable mediums, and other technologies related to any of the above.

BRIEF DESCRIPTION OF THE DRAWINGS

Embodiments of the disclosure have other advantages and features which will be more readily apparent from the following detailed description and the appended claims, when taken in conjunction with the accompanying drawings, in which:

FIGS. 2A-2H are cross-sectional views illustrating fabrication of an integrated multi-color LED display panel by a multi-stage alignment bonding and substrate removal process, according to one embodiment.

FIGS. 3A-3C are cross-sectional views illustrating application and planarization of a dielectric coating, according to one embodiment.

The figures depict various embodiments for purposes of illustration only. One skilled in the art will readily recognize from the following discussion that alternative embodiments of the structures and methods illustrated herein may be employed without departing from the principles described herein.

DETAILED DESCRIPTION OF THE PREFERRED EMBODIMENTS

The figures and the following description relate to preferred embodiments by way of illustration only. It should be noted that from the following discussion, alternative embodiments of the structures and methods disclosed herein will be readily recognized as viable alternatives that may be employed without departing from the principles of what is claimed.

Figure 1A:
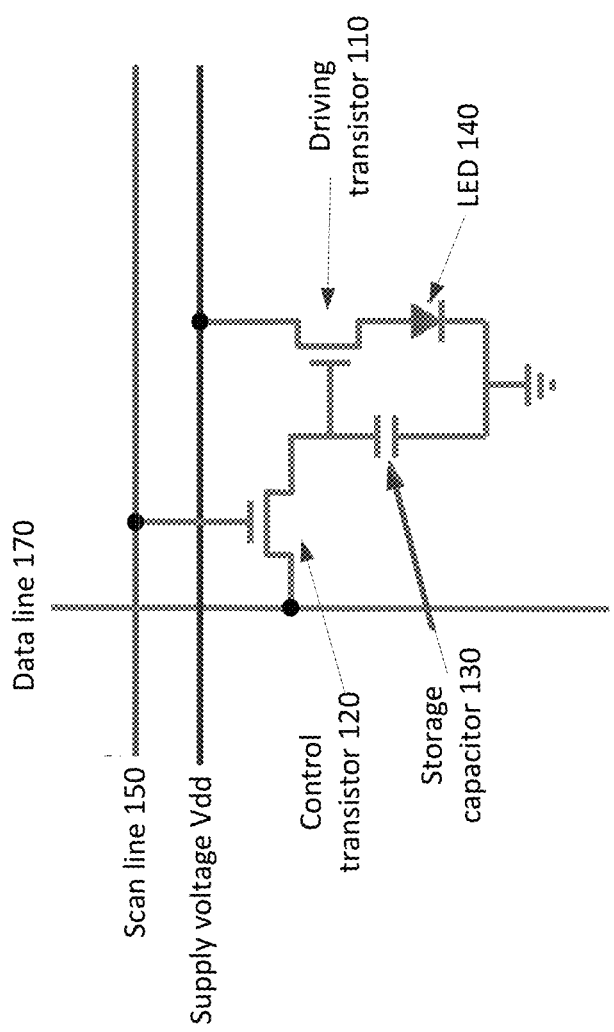
FIG. 1A is a circuit diagram of a pixel driver, according to one embodiment.

FIG. 1A is a circuit diagram of a pixel of a display panel, which includes a pixel driver and LED 140. In this example, the pixel driver includes two transistors and one capacitor 130, with one transistor being a control transistor 120 and the other being a driving transistor 110. In this example, the control transistor 120 is configured with its gate connected to a scan signal bus line 150, its one source/drain connected to a data signal bus line 170, and the other drain/source connected to the storage capacitor 130 and to the gate of the driving transistor 110. One source/drain of the driving transistor 110 is connected to a voltage supply, Vdd, and the other drain/source is connected to the p-electrode of the LED 140. The n-electrode of the LED 140 is connected to the capacitor 130 and to ground. In this example, when the scan signal 150 opens the gate of the control transistor 120, the data signal 170 charges the storage capacitor 130 and sets the driving transistor 110's gate voltage, which controls the current flow through the LED 140. The storage capacitor 130 here is used to maintain the gate voltage of the driving transistor 110, thus maintaining the current flowing through the LED 140 during the time that the scan signal 150 is setting other pixels. Other pixel driver designs will be apparent, for example as described in U.S. Provisional patent application Ser. No. 12/214,395, "Monolithic Active or Passive Matrix LED Array Display Panels and Display Systems Having the Same," which is incorporated herein by reference.

Figure 1B:
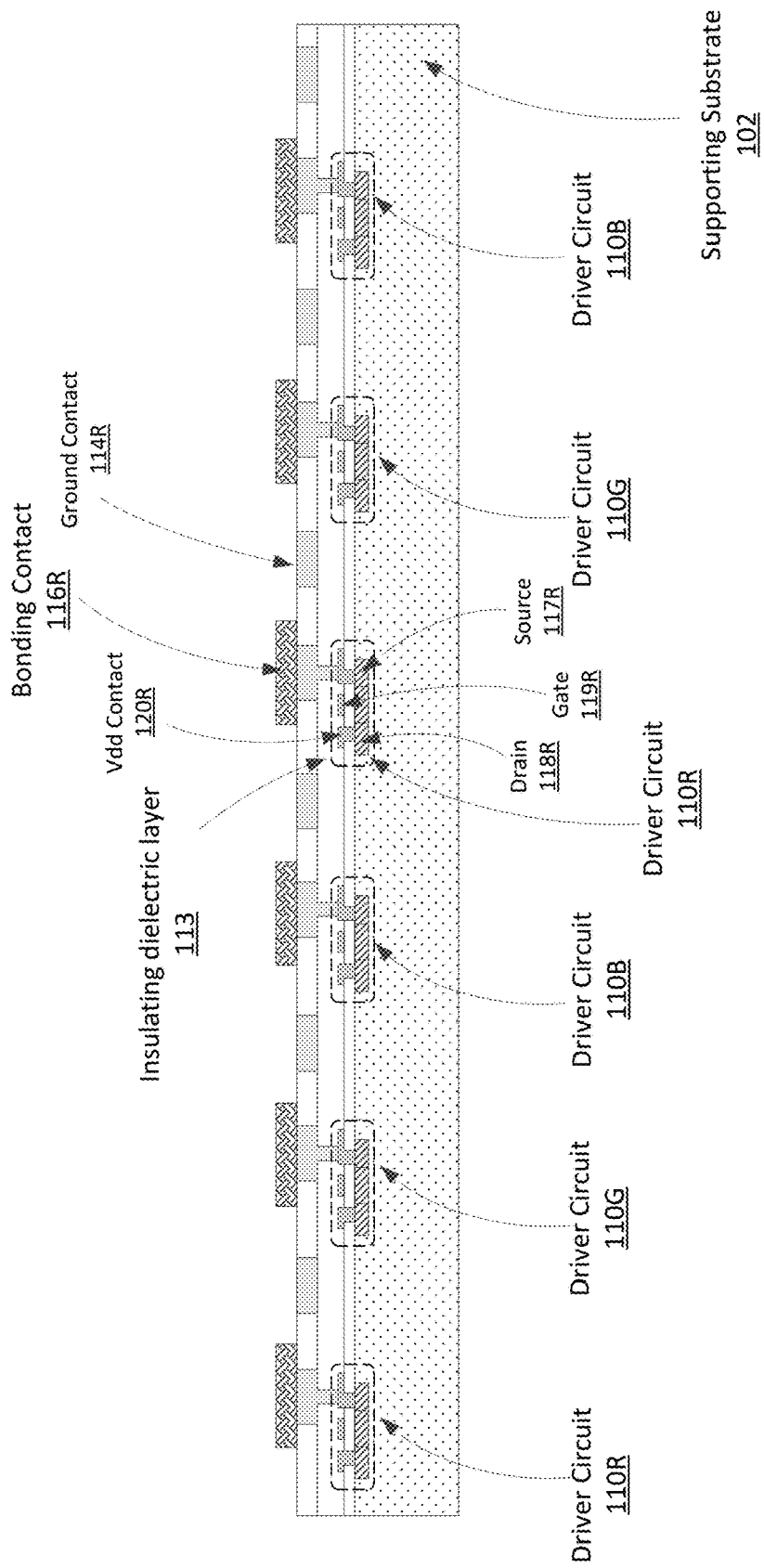
FIG. 1B is a cross-sectional view of a host wafer with an array of pixel drivers fabricated on a supporting substrate, according to one embodiment.

FIG. 1B is a cross-sectional view of example driver circuitry fabricated on a supporting substrate 102, according to one embodiment. In FIG. 1B, an array of individual driver circuits 110 are fabricated on the supporting substrate 102. The driver circuits 110 are labeled with suffixes R,G,B, because they correspond to red, green and blue pixels. For convenience, the resulting wafer will be referred to as the host wafer. The array of pixel drivers 110 are connected to LEDs (not shown in FIG. 1B) via alignment bonding and substrate removal to form an integrated LED display panel, as more fully described below. In this example, comparing to FIG. 1A, only the driving transistor 110 of each pixel driver circuit is shown in FIG. 1B for clarity. The driving transistor 110 is a CMOS driver circuit with its source 117 connected to a contact 116 that will be bonded to the LED. In alternative embodiments not shown, the driver circuitry can also be TFT circuitry.

For clarity, FIG. 1B shows only six driver circuits 110 labeled with 110R, 110G and 11B, which corresponds to red LEDs, green LEDs and blue LEDs, as described below. It should be understood that the driver circuitry can include a different number of driver circuits. In a fully programmable display panel, the LEDs and driver circuits are arranged in arrays to form an array of individually addressable pixels, preferably color pixels. In alternate embodiments, the display panel may have a more limited programmability and the pixels may be arranged in different geometries. In addition, there does not have to be a one to one correspondence between driver circuits and LEDs. For example, there could be two or more LEDs connected to the same pixel driver output to create redundancy, so that if one of the LEDs fails, the remaining LEDs could still light the pixel.

Returning to FIG. 1B, in more detail, the driver circuitry 100 is fabricated as follows. The supporting substrate 102 is the substrate on which the array of individual driver circuits 110 is fabricated. In one embodiment, the substrate 102 is a Si substrate. In another embodiment, the supporting substrate 102 is a transparent substrate, for example, a glass substrate. Other example substrates include GaAs, GaP, InP, SiC, ZnO, and sapphire substrates.

The driver circuits 110 form individual pixel drivers to drive LEDs that will be bonded to the driver circuits, as described below. In the example shown in FIG. 1B, a driver circuit 110 is a CMOS driver circuit that includes a source 117, a drain 118 and a gate 119. The source 117 is further connected to an electrode that contacts the bonding contact 116. The drain 118 is connected to an external voltage supply via a Vdd contact 120. In alternate embodiments, the position of the drain 118R and the source 117R can be switched depending on the channel type of the driver circuit 110R (e.g., n-channel or p-channel FET).

An insulating dielectric layer 113 is formed to electrically separate the Vdd contact 120, the gate 119 and the electrode from the source 117. A ground contact 114 is also formed within each pixel driver, to which the corresponding LED will be connected. The LED will contact the bonding contact 116 on one side and the ground contact 114 on the other side. In alternative embodiments not shown, the driver circuitry can include driver circuits other than CMOS driver circuits. As one example, the driver circuitry may include thin-film transistor (TFT) driver circuits. As another example, the driver circuitry can be circuitry using III-V compound semiconductors.

As more fully described below, a bonding contact 116 is formed for each driver circuit 110 on top of the insulating dielectric layer 113 to make contact with a bonding contact of a corresponding LED, enabling the driver circuit 110 to be electrically coupled to the LED. The array of driver circuits 110 are electrically connected to corresponding LEDs via alignment bonding and substrate removal to form an integrated LED display. The bonding contact 116 is an ohmic contact, for example a metal contact.

Figure 2B:
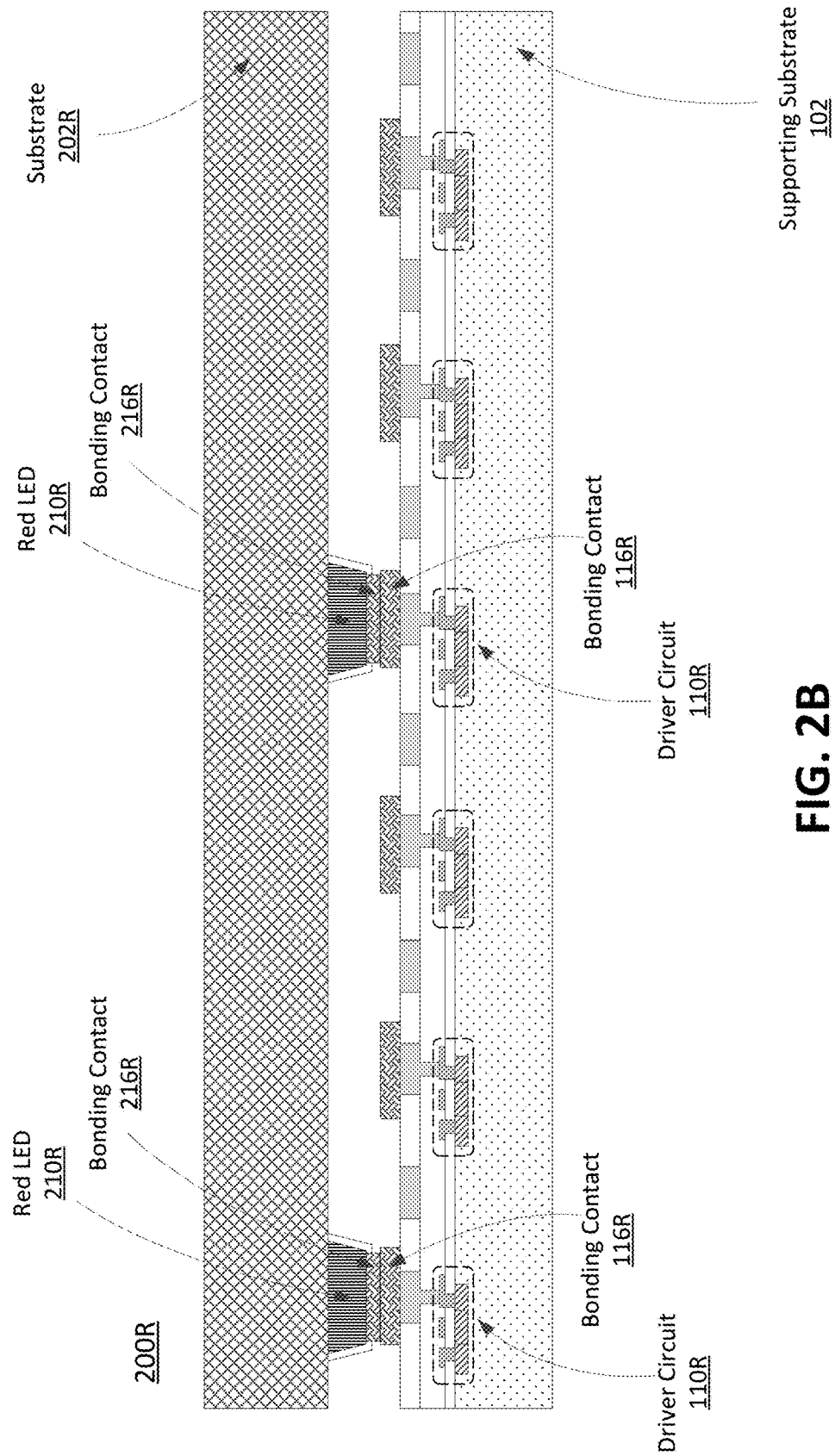
Figure 2C:
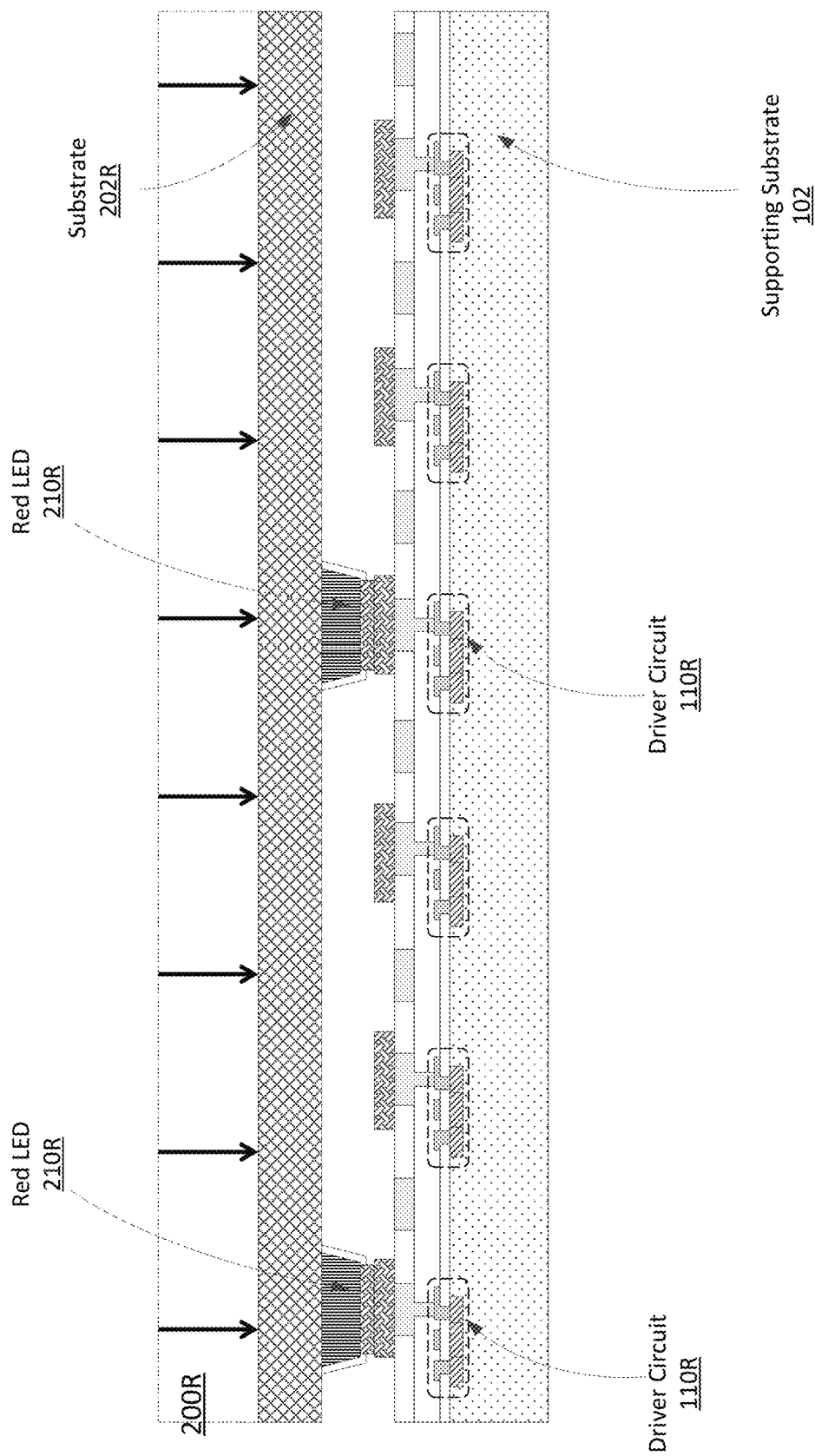
Figure 2D:
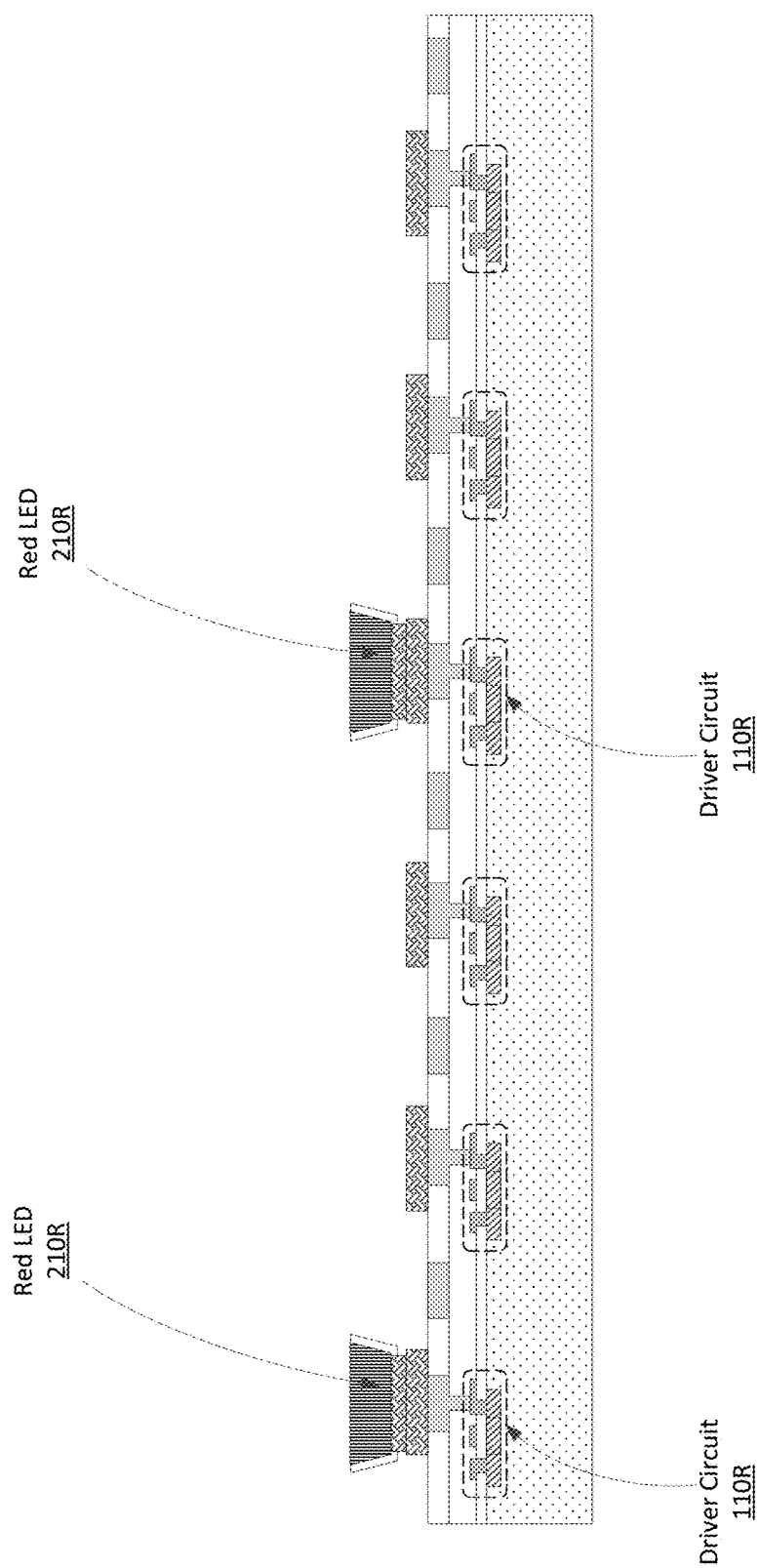
Figure 2E:
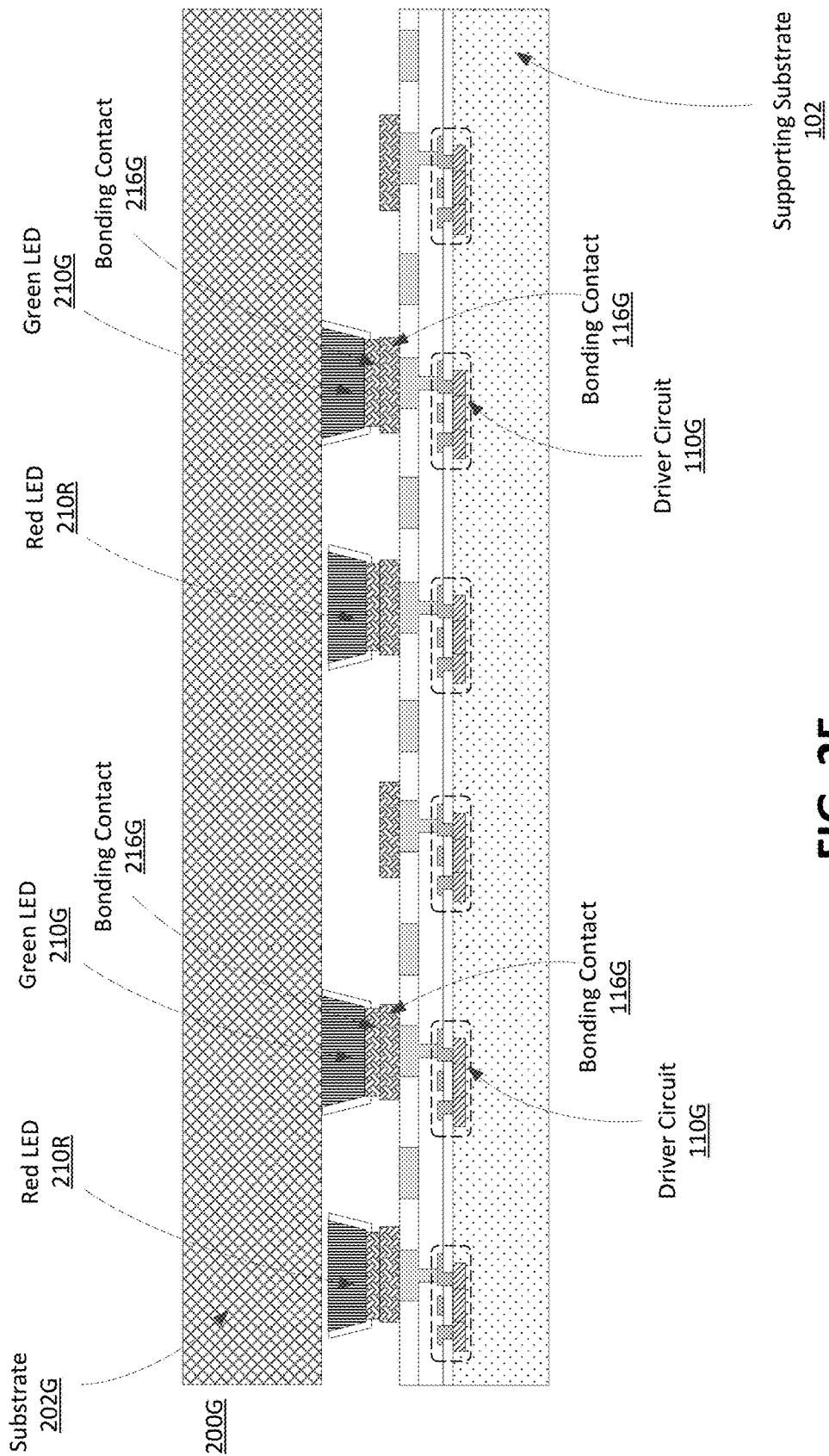
Figure 2F:
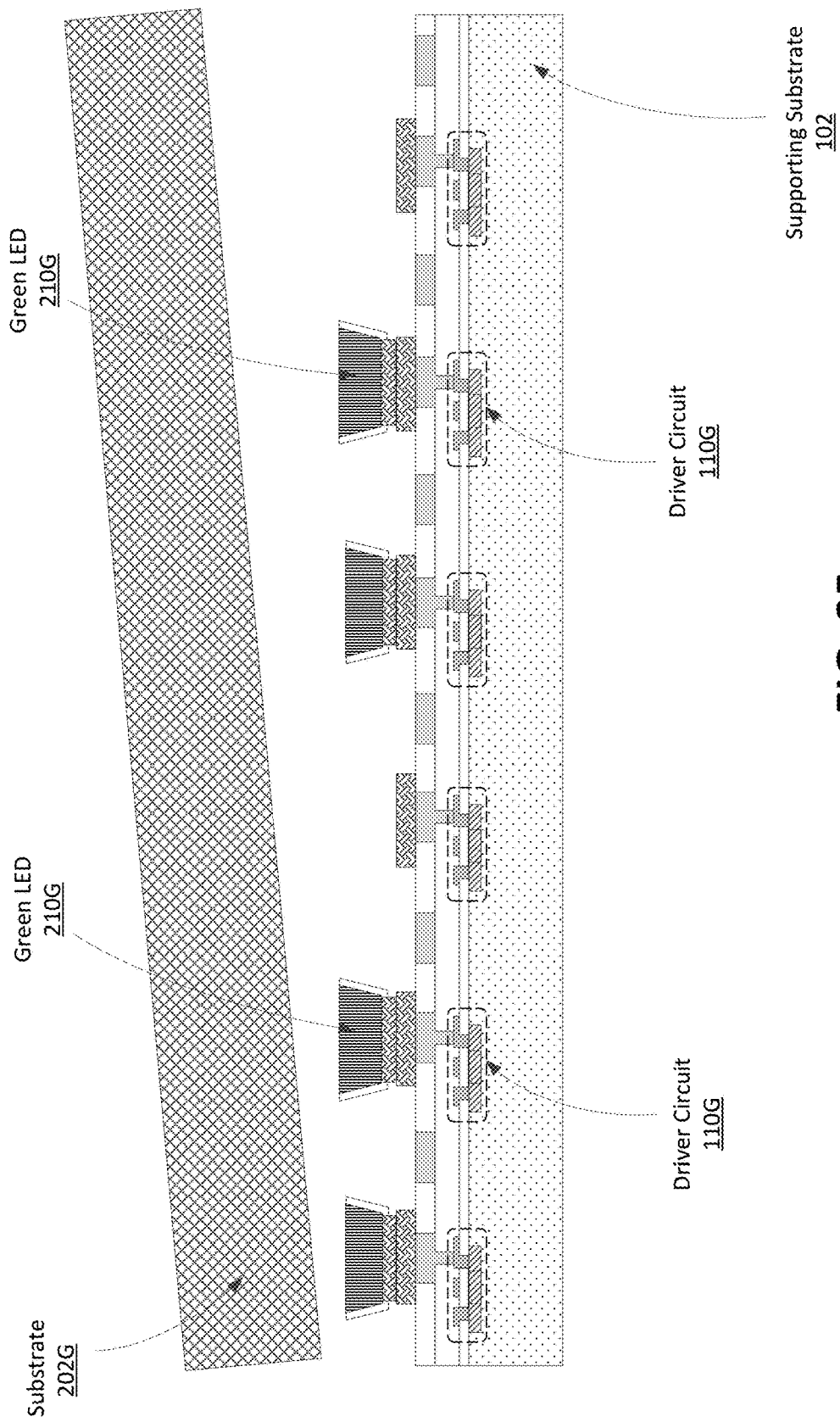
Figure 2G:
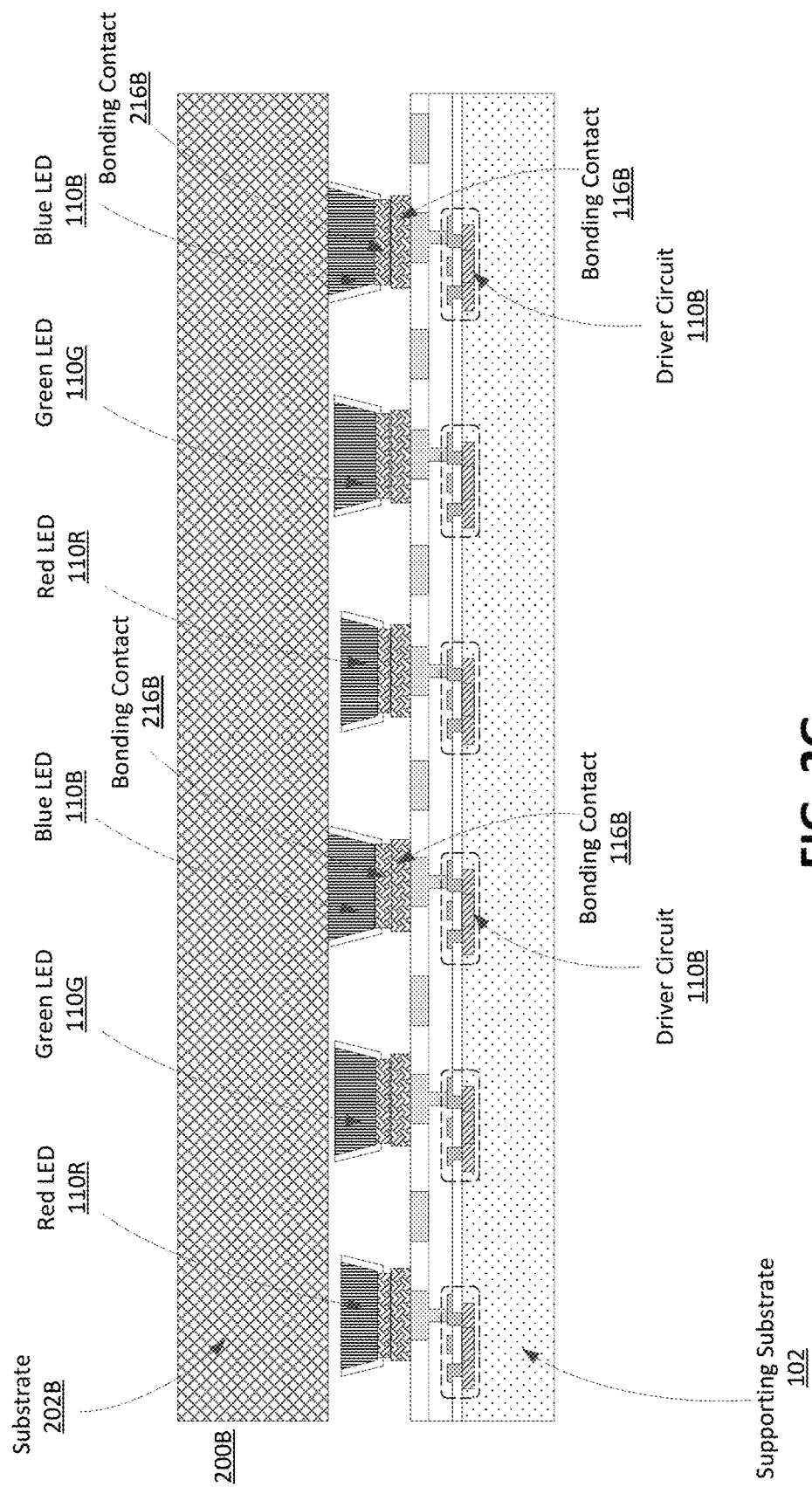
Figure 2H:
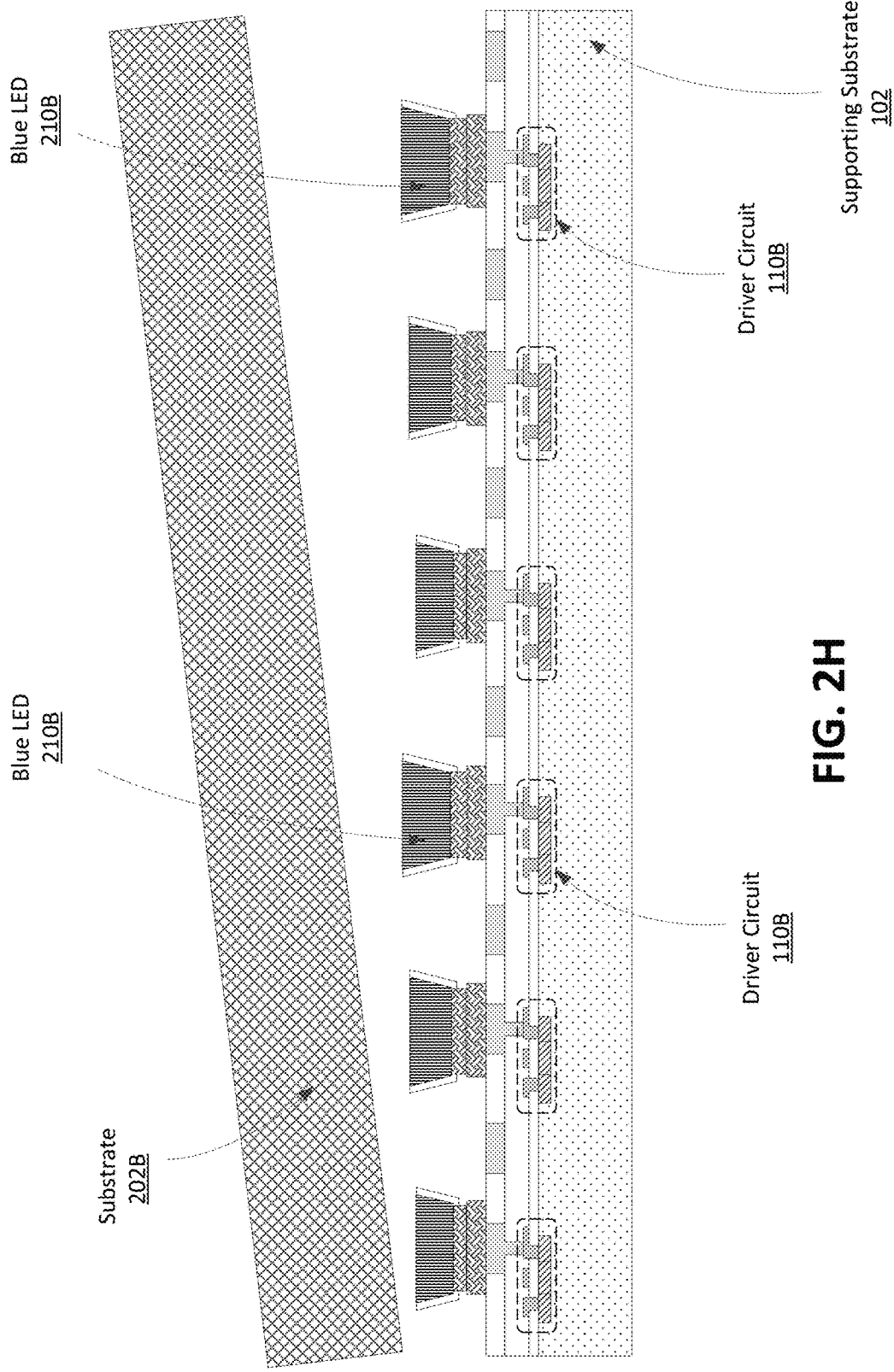

FIGS. 2A-2H illustrate the manufacturing process of multi-stage alignment bonding and substrate removal to form an integrated LED display fabricated with the driver circuitry shown in FIG. 1. More specifically, FIGS. 2A-2D illustrate bonding of red LEDs to the host wafer, FIGS. 2E-2F illustrate bonding of blue LEDs to the host wafer, and FIGS. 2G-2H illustrate bonding of green LEDs to the host wafer.

FIG. 2A is a cross-sectional view of a first LED wafer 200R, which includes an array of red LEDs 210R fabricated on a substrate 202R. In one embodiment, the substrate 202R can be a GaAs substrate. In another embodiment, the substrate 202R can be a transparent substrate, for example a sapphire substrate. In one embodiment, the LEDs 210R are arranged in an array on the substrate 202R to form a fully programmable display panel with individually addressable pixels after the LEDs are integrated onto the host wafer shown in FIG. 1. For clarity, FIG. 2A shows only two LEDs 210R fabricated on the substrate 202R. It should be understood that the LED wafer 200R can include a different number of LEDs.

The LEDs 210R are epitaxially grown on the substrate 202R. A passivation layer 223R is formed to electrically isolate individual LEDs 210R on the LED wafer 200R, and a bonding layer is formed on top of the LEDs, in which case for each of the LEDs, a bonding contact 216R is formed to electrically coupled to a corresponding driver circuit 110R as described above in FIG. 1.

In FIG. 2A, the LEDs 210R are red LEDs. As more fully described below, a full-color LED display panel is formed by integrating the red LED wafer 200R of FIG. 2A, the green LED wafer 200G of FIG. 2E and a blue LED wafer 200B of FIG. 2G via multiple stages of alignment bonding and substrate removal. In alternative embodiments not shown, an LED wafer including ultraviolet (UV) LEDs covered with phosphor layers or nano-particles can also be used to form a full-color LED display via alignment bonding and substrate removal. Single-color LED display panels can also be fabricated, for example if the LEDs from different LED wafers are all the same color. Alternately, same color LEDs with different color phosphors or nano-particles may be used to fabricate a multi-color display.

LEDs typically have a pair of contacts, one to the p-layer and one to the n-layer of the LED. In the embodiment of FIG. 2A, only one contact of the pair is connected via the bonding process. In this example, the bonding contact 216 is connected to the p-layer of the LED.

FIG. 2B is a cross-sectional view of the first LED wafer 200R bonded to the driver circuitry 110 on the supporting substrate 102, according to one embodiment. In FIG. 2B, the red LED wafer 200R illustrated in FIG. 2A is flip chip bonded to the driver circuitry 110. More specifically, the bonding contacts 216R formed on the red LED wafer 200R are bonded to the corresponding bonding contacts 116R formed on the host wafer. Each red LED 210R is aligned to a corresponding driver circuit 110R.

FIG. 2C is a cross-sectional view illustrating removal of the substrate 202R, according to one embodiment. In FIG. 2C, the substrate 202R of the LED wafer 200R is removed to expose the LEDs 210R that have been bonded to the corresponding driver circuits 110R. Removing the substrate 202R also allows further stages of alignment bonding and substrate removal, during which other LED wafers are bonded to the driver circuitry 110. In one embodiment, the substrate 202R is removed via wet chemical etching. For example, wet chemical etching may be applied by using an ammonium hydroxide ($NH_4OH$) and hydrogen peroxide ($H_2O_2$) mixture to remove the substrate 202R.

FIG. 2D is a cross-sectional view after the substrate 202R is removed, according to one embodiment. In FIG. 2D, the substrate of the LED wafer is removed to expose the individual LEDs 210R that haven been electrically coupled to corresponding driver circuits 110R on the host wafer. As described above, the device structure shown in FIG. 2D can form the basis of a single-color LED display, in this example a red LED display.

FIG. 2E is a cross-sectional view of a second LED wafer 200G bonded to the driver circuitry 11 on the host wafer shown in FIG. 2D, according to one embodiment. In FIG. 2E, a second LED wafer 200G is flip chip bonded to the corresponding driver circuitry 110 on the supporting substrate 102 after the first LEDs 210R are bonded to driver circuitry. Similar to the LED wafer 200R shown in FIG. 2A, the second LED wafer 200G includes a substrate 202G on which an array of green LEDs 210G are epitaxially grown. The LED wafer 200G also includes a passivation layer to electrically isolate individual LEDs 210G, and a bonding layer that further includes, for each individual LED, a bonding contact 216G formed on top of the LED to further contact a corresponding driver circuit 110G. Different from the LED wafer 200R shown in FIGS. 2A-2D, the LED wafer 200G includes green LEDs 210G instead of red LEDs 210R. The bonding contact 216G for each green LED 210G is connected to a bonding contact 116G for the corresponding driver circuit 110G. In FIG. 2E, the green LEDs 210G are shown as taller than the red LEDs 210R in order to distinguish the different LEDs. However, the total height of the green LEDs 210G and bonding contact 216G must be sufficient to avoid physical interference between the red LEDs 210R (or other features) and the substrate 202G.

FIG. 2F is a cross-sectional view illustrating removal of the substrate 202G for the second LED wafer, according to one embodiment. In FIG. 2F, the substrate 202G of the green LED wafer 200G is removed to expose the green LEDs 210G. In one embodiment, the substrate 202G can be removed via a laser lift off process.

FIG. 2G is a cross-sectional view of a third LED wafer 200B bonded to the driver circuitry 110 on the host wafer shown in FIG. 2F, according to one embodiment. In FIG. 2G, a third LED wafer 200B is flip chip bonded to the driver circuitry 110 after the LEDs 210R and 210G were previously bonded to the driver circuitry. Similar to the previous LED wafers, the third LED wafer 200B includes a substrate 202B on which an array of LEDs 210B are epitaxially grown. The LED wafer 200B also includes a passivation layer to electrically isolate individual LEDs 210B, and a bonding layer that further includes, for each individual LED, a bonding contact 216B formed on top of the LED to be further connected to a corresponding driver circuit 110B. Different from the previous LED wafers, the third LED wafer 200B includes blue LEDs 210B. As shown in FIG. 2G, the bonding contact 216B for each blue LED 210B is connected to a bonding contact 116B for a corresponding driver circuit 110B.

FIG. 2H is a cross-sectional view showing removal of the substrate 202B of the third LED wafer, according to one embodiment. In FIG. 2H, the substrate 202B of the blue LED wafer 200B is removed to expose the blue LEDs 210B. In this example, the LED wafer 200B is the last LED wafer that is integrated onto the host wafer to form a full-color LED display. In one embodiment, the substrate 202B can be removed via laser lift off process. In alternative embodiments not shown, during a multi-stage alignment and substrate removal manufacturing process to form a semiconductor device (e.g., an LED display), the substrate of the last wafer (e.g., LED wafer 200B) remains instead of being removed. For example, the substrate 202B of the LED wafer 202B shown in FIG. 2G may remain to function as a protection cover for the full-color display. An anti-reflection coating may be applied to the remaining substrate.

In this example, after all of the LED wafers 200R, 200G and 200B are bonded to the host wafer, one connection to the LEDs 210 has been made. Specifically, the p-layer of each LED 210 is connected via the bonding contacts 216-116 to the source 117 of the corresponding driving transistor 110. As described above with reference to FIG. 1B, in alternative embodiments not shown, the position of the drain and the source can be switched depending on the channel type of the FET.

Note that the wafer bonding shown in FIGS. 2A-H can occur either before or after dicing. In one approach, the bonding is wafer to wafer bonding. Referring to FIG. 2B, an entire red LED wafer 200R is bonded to the entire driver circuitry wafer before either wafer is diced into individual die. In another approach, the bonding is die to die bonding. In that case, the red LED wafer 200R shown in FIG. 2B is actually a single die (or set of dies). The driver circuitry could also be a single die, a set of dies, or a full wafer. For convenience, the terms wafer bonding, LED wafer, and other similar terms are intended to include all of these variations.

Figure 3C:
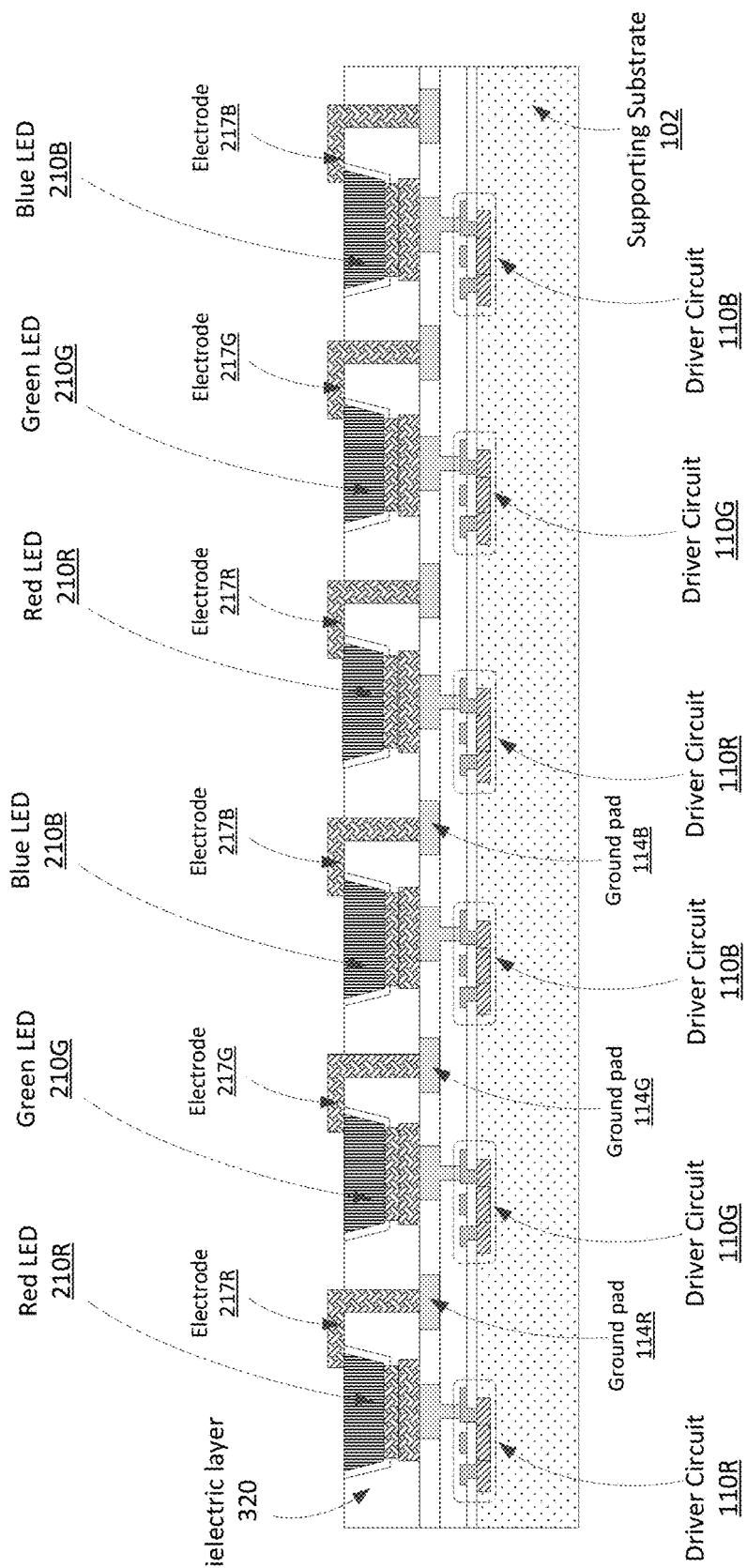

FIGS. 3A-3C illustrate connection to the other contact of the LED (i.e., connecting the n-layer of the LED to ground), according to one embodiment.

FIG. 3A is a cross-sectional view illustrating the application of a dielectric coating 320 to the device structure fabricated in FIG. 2H, according to one embodiment. In FIG. 3A, the dielectric coating 320 is formed on the plurality of LEDs on the supporting substrate 102. The dielectric coating 320 can be made from a variety of electrically insulating materials, such as SiO2, SiNx, and polymers. It could be applied by a variety of methods, such as chemical vapor deposition (CVD), sputter deposition, e-beam evaporation, and spin coating. In one embodiment, as described above, the dielectric coating 320 electrically isolates individual LEDs from each other. The dielectric coating 320 may also be used to planarize the surface.

FIG. 3B is a cross-sectional view, where part of the dielectric coating has been removed to expose the LEDs, according to one embodiment. The dielectric coating can be removed via different methods, e.g., by etching back process such as ME etching, ICP etching, ion milling, ion beam etching, etc. In FIG. 3B, the top part of the dielectric coating 320 that covers the LEDs is removed to expose the individual LEDs. In this way, the LEDs can make electrical contact with circuitry on the host wafer, as shown in FIG. 3C. The n-contact that is associated with the n-layer of each LED is connected to a ground contact 114 via an electrode 217.

In FIG. 3C, the display panel is fabricated after multiple stages of wafer bonding and substrate removal. In each stage, LEDs 210 on an LED wafer are bonded to corresponding driver circuitry 110 on the host wafer. In this example, red LEDs 210R are first bonded to corresponding driver circuits 110R, green LEDs 210G are then bonded to corresponding driver circuits 110G, and finally blue LEDs 210B are bonded to corresponding driver circuits 110B. FIG. 3C shows merely one example. In alternate embodiments, the sequence of bonding different color LEDs to the driver circuits can be altered. For example, green LEDs can be first bonded to driver circuitry 110G, then red LEDs are bonded to driver circuitry 110R, and finally blue LEDs are bonded to driver circuitry 110B. Likewise, the colors of the LEDs are not limited to red, green, and blue. Other color combinations are also possible, for example blue and yellow, or blue/green/orange/red.

Each LED 210 has a pair of contacts (for n- and p-layers). One contact is connected via bonding contacts 116-216 to the output of a corresponding driving transistor 110. The other contact of the LED is connected to ground. In this example, the connection to ground is made after bonding of all the LED wafers has been completed. In this example, the ground connection is distributed inside the driver IC to every pixel and each pixel driver circuit has its ground pad to electrically connect to the n-electrode of the LEDs. The connection of all the ground pads to the ground bus line of the driver IC is made internally to the driver IC. In another embodiment, the ground connection inside the driver IC is distributed only to certain locations instead of to every pixel where common ground pads are made. The electrical connection of the n-electrodes of the LEDs to these common ground pads on the driver IC are made after all the LEDs are bonded to the driver IC.

Figure 4:
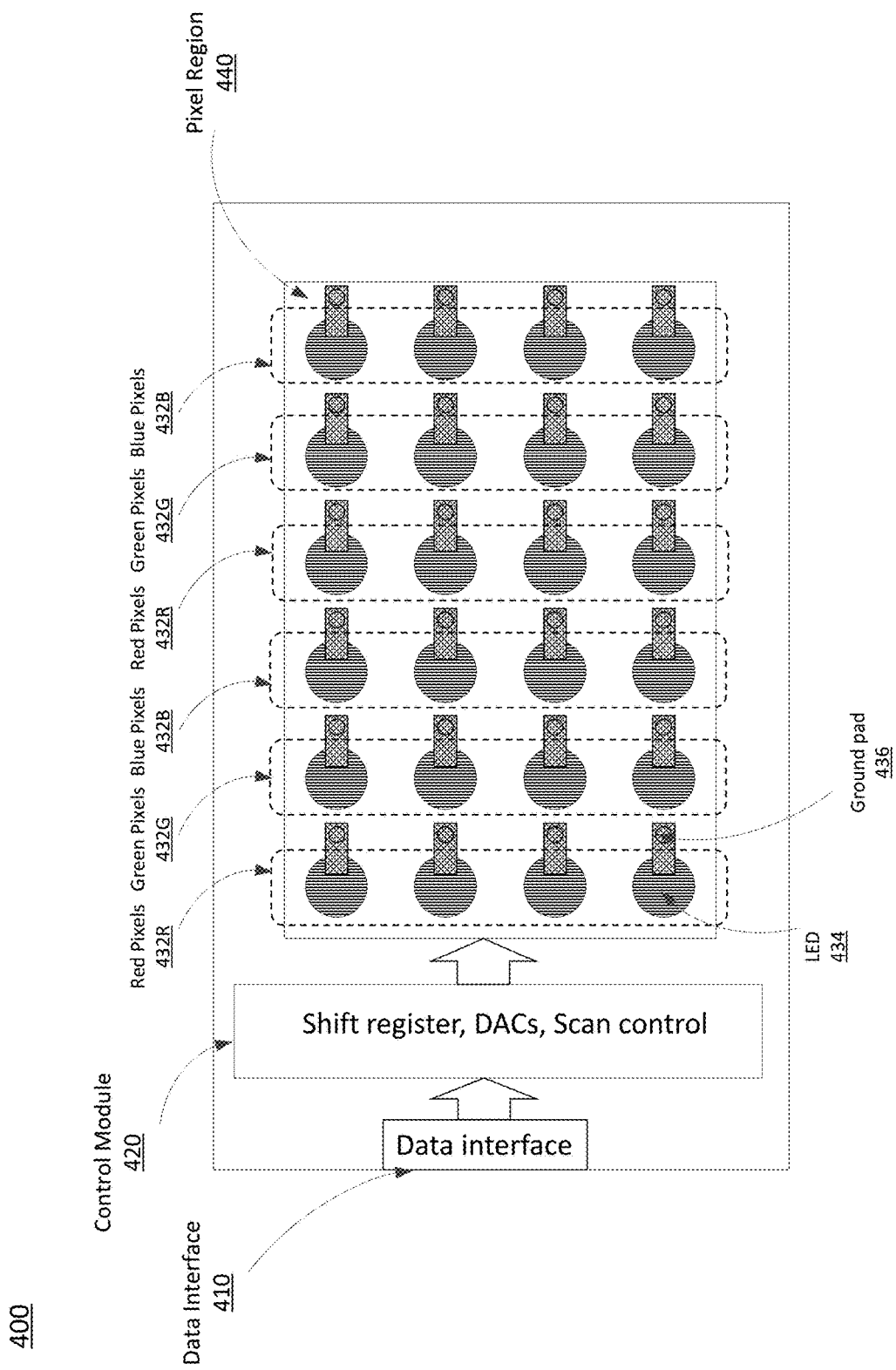
FIG. 4 is a top view of an example display panel with an array of pixels, according to one embodiment.

FIG. 4 is a top view of an example LED display panel 400, according to one embodiment. The display panel 400 includes a data interface 410, a control module 420 and a pixel region 440. The data interface 410 receives data defining the image to be displayed. The source(s) and format of this data will vary depending on the application. The control module 420 receives the incoming data and converts it to a form suitable to drive the pixels in the display panel. The control module 420 may include digital logic and/or state machines to convert from the received format to one appropriate for the pixel region 440, shift registers or other types of buffers and memory to store and transfer the data, digital-to-analog converters and level shifters, and scan controllers including clocking circuitry.

The pixel region 440 includes an array of pixels. The pixels include LEDs 434 monolithically integrated with pixel drivers, for example as described above or in the following figures. In this example, the display panel 400 is a color RGB display panel. It includes red, green and blue pixels, arranged in columns. Columns 432R are red pixels, columns 432G are green pixels and columns 432B are blue pixels. Within each pixel, an LED 434 is controlled by a pixel driver. The pixel makes contact to a supply voltage (not shown) and ground via a ground pad 436, and also to a control signal, according to the embodiments shown previously. Although not shown in FIG. 4, the p-electrode of LED and the output of the driving transistor are positioned underneath the LED 434, and they are electrically connected by bonding metal. The LED current driving signal connection (between p-electrode of LED and output of the pixel driver), ground connection (between n-electrode and system ground), the Vdd connection (between source of the pixel driver and system Vdd), and the control signal connection to the gate of the pixel driver are made in accordance with various embodiments described previously.

FIG. 4 is merely a representative figure. Other designs will be apparent. For example, the colors do not have to be red, green and blue, and there do not have to be equal numbers of each color pixel. They also do not have to be arranged in columns or stripes. A set of four color pixels could be arranged as a 2×2 square, for example. Individual pixel cells could also be arranged to share row or column addressing, thus reducing the total number of row or column traces. As one example, apart from the arrangement of a square matrix of pixels shown in FIG. 4, an arrangement of hexagonal matrix of pixels can also be used to form the display panel 400.

In some applications, a fully programmable rectangular array of pixels is not necessary. Other designs of display panels with a variety of shapes and displays may also be formed using the device structures described herein. One class of examples is specialty applications, including signage and automotive. For example, multiple pixels may be arranged in the shape of a star or a spiral to form a display panel, and different patterns on the display panel can be produced by turning on and off the LEDs. Another specialty example is automobile headlights and smart lighting, where certain pixels are grouped together to form various illumination shapes and each group of LED pixels can be turned on or off or otherwise adjusted by individual pixel drivers.

Even the lateral arrangement of devices within each pixel can vary. In FIGS. 1-3 the LEDs and pixel drivers are arranged vertically. Each LED is located "on top of" the corresponding pixel driver circuit. Other arrangements are possible. For example, the pixel drivers could also be located "behind", "in front of" or "beside" the LED.

Different types of display panels can be fabricated. For example, the resolution of a display panel can range typically from 8×8 to 3840×2160. Common display resolutions include QVGA with 320×240 resolution and an aspect ratio of 4:3, XGA with 1024×768 resolution and an aspect ratio of 4:3, HD with 1280×720 resolution and an aspect ratio of 16:9, FHD with 1920×1080 resolution and an aspect ratio of 16:9, UHD with 3840×2160 resolution and an aspect ratio of 16:9, and 4 K with 4096×2160 resolution. There can also be a wide variety of pixel sizes, ranging from sub-micron and below to 1 mm and above. The size of the overall display region can also vary widely, ranging from diagonals as small as tens of microns or less up to hundreds of inches or more.

Different applications will also have different requirements for optical brightness. Example application include direct viewing display screens, light engines for home/office projectors and portable electronics such as smart phones, laptops, wearable electronics, and retinal projections. The power consumption can vary from as low as a few milliwatts for retinal projectors to as high as kilowatts for large screen outdoor displays, projectors, and smart automobile headlights. In terms of frame rate, due to the fast response (nano seconds) of inorganic LEDs, the frame rate can be as high as KHz, or even MHz for small resolutions.

In the example of FIGS. 2-3, the bonding of the LED wafer to the host wafer made one electrical connection to the LED. In the example of FIG. 5, the bonding makes both connections.

Figure 5A:
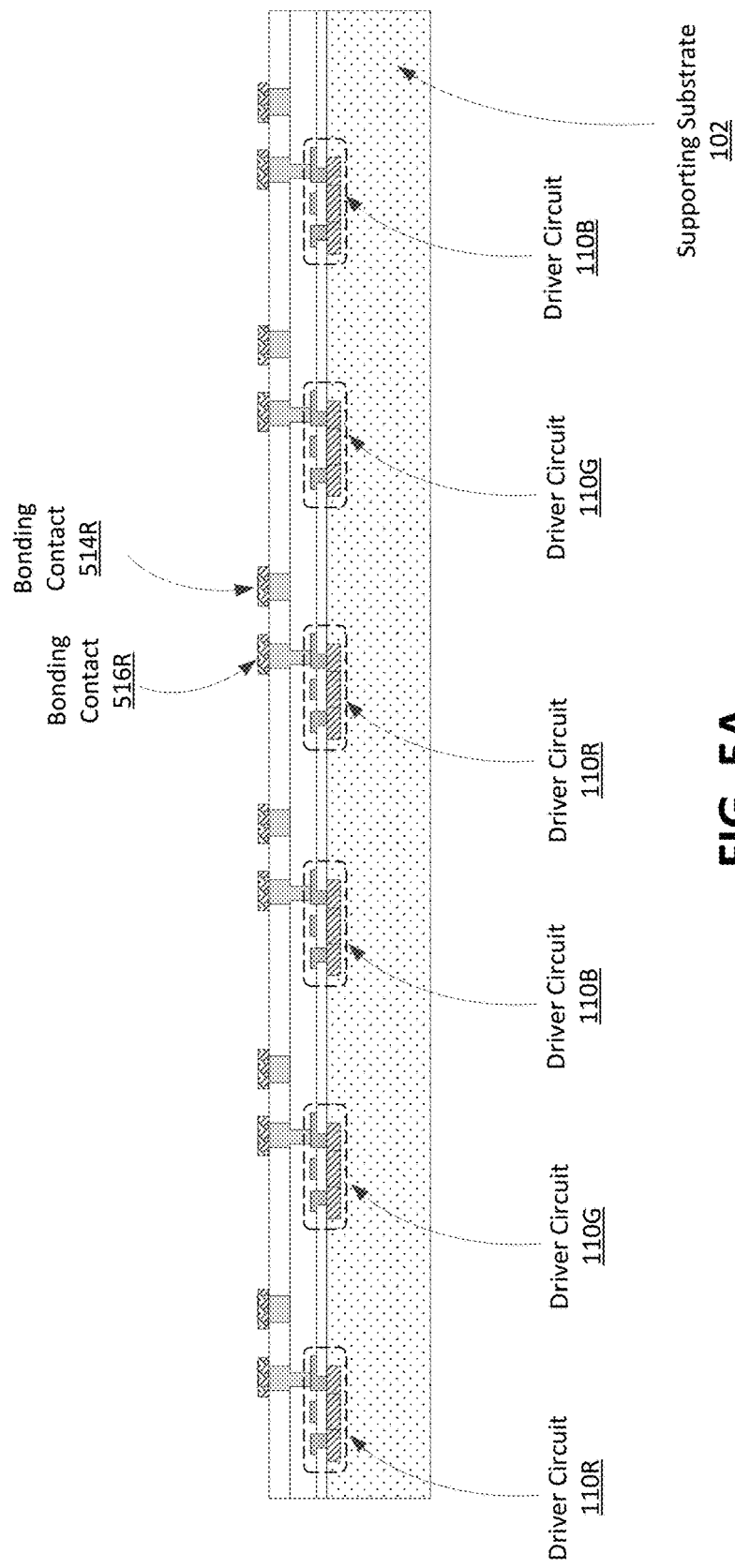
FIGS. 5A-5E are cross-sectional views illustrating fabrication of an integrated multi-color LED display panel by a multi-stage alignment bonding and substrate removal process, according to another embodiment.

FIG. 5A is a cross-sectional view of a host wafer that includes an array of driver circuits 110 fabricated on a supporting substrate 102, according to one embodiment. This design is similar to that shown in FIG. 1B, except that there are additional bonding contacts 514. In FIG. 1B, for each pixel, there was one bonding contact 116 which connected to the driving transistor 110. In FIG. 5A, there are two bonding contacts 516 and 514. Bonding contact 516 connects to the driving transistor 110, as in FIG. 1B. However, bonding contact 514 connects to a ground bus line.

Figure 5B:
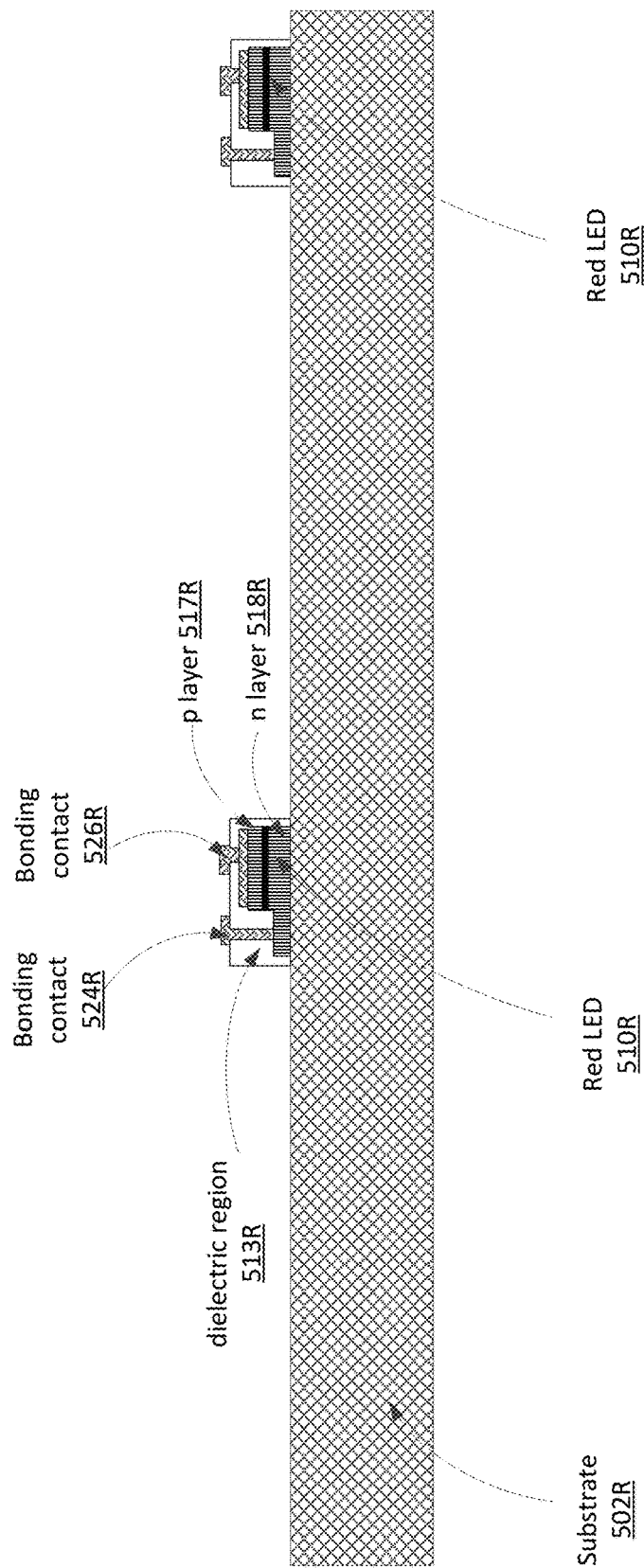

FIG. 5B is a cross-sectional view of a first LED wafer that includes an array of red LEDs 510R epitaxially grown on a substrate 502R, according to one embodiment. Unlike the LED wafers in FIGS. 2-3, both p-layer 517R and n-layer 518R of the red LED 510R are connected to bonding contacts 526R and 524R, respectively. A dielectric layer 513R isolates the two contacts from each other.

Figure 5C:
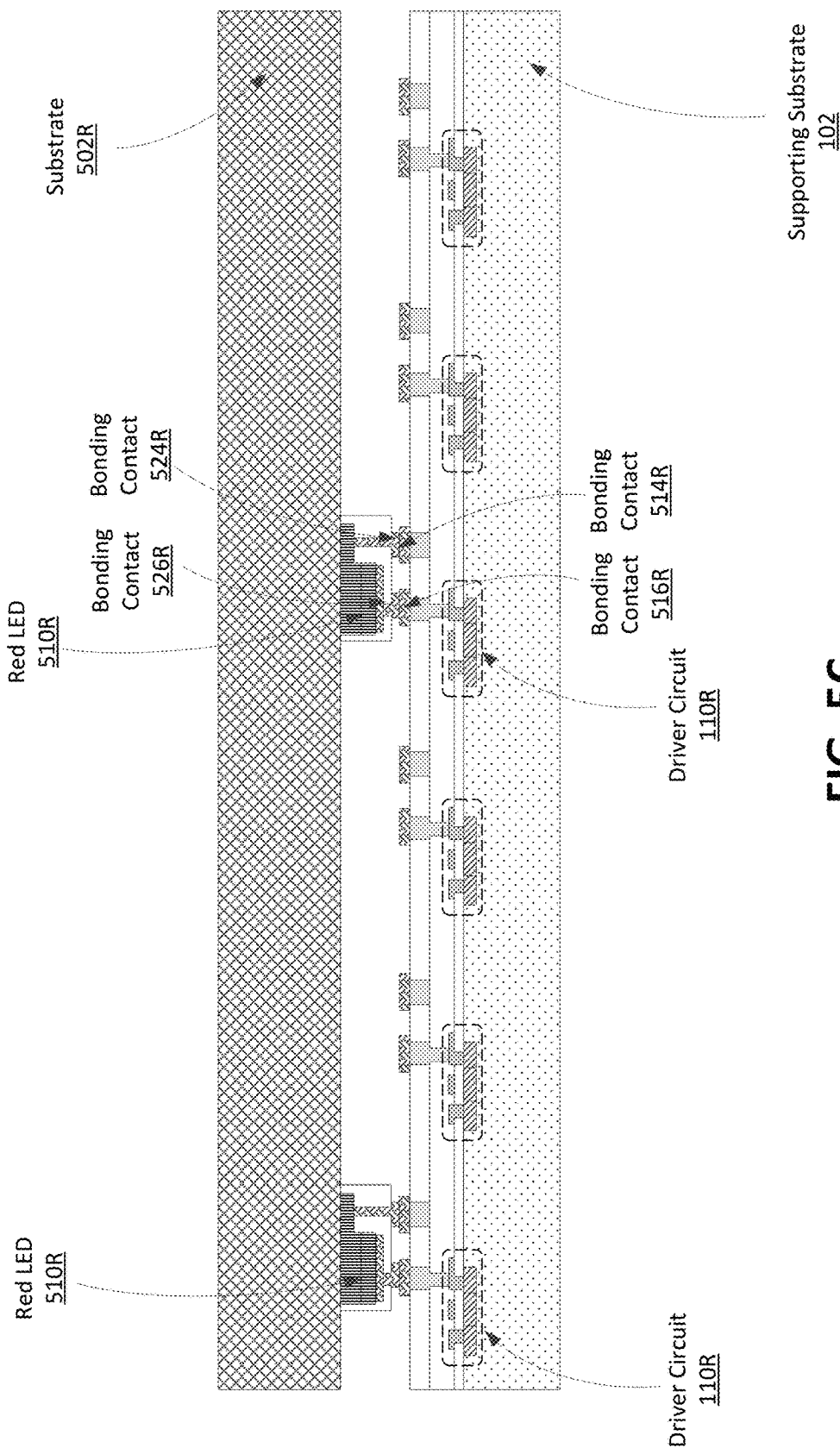

FIG. 5C is a cross-sectional view of the red LED wafer bonded to the host wafer, according to one embodiment. In FIG. 5B, the red LED 510R is flip chip bonded to the driver circuitry 110R on the supporting substrate 102. More specifically, for each LED 510R, the p-layer bonding contact 526R is connected to the bonding contact 516R for the corresponding driver circuit 110R, and the n-layer bonding contact 524R is connected to the bonding contact 514R connected to ground.

Figure 5D:
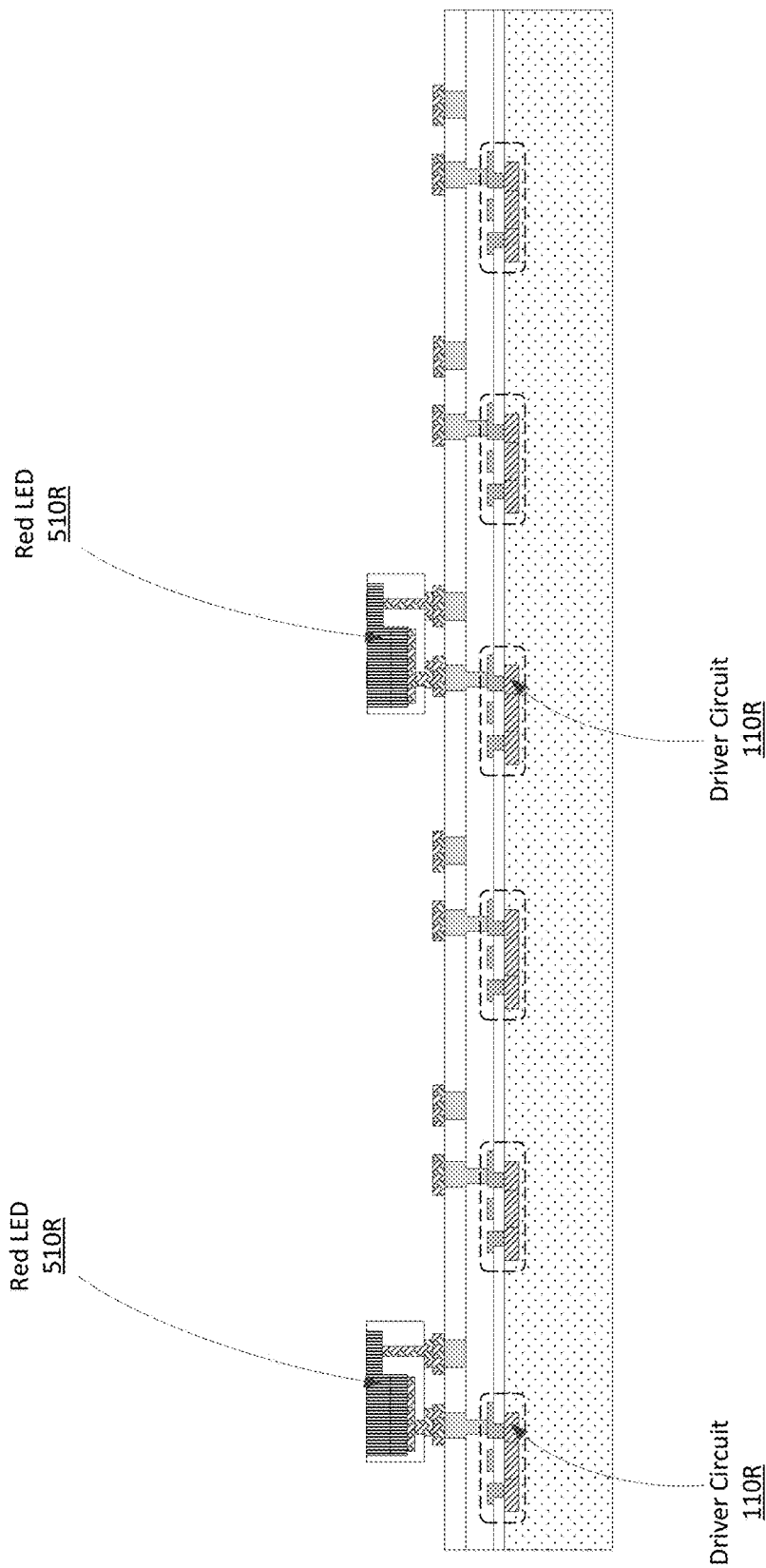

FIG. 5D is a cross-sectional view after the substrate 502R is removed, according to one embodiment. Wet chemical etching or laser lift off may be used to remove the substrate 502R. In FIG. 5D, the substrate of the LED wafer is removed to expose the individual LEDs 510R that have been bonded to corresponding driver circuits 110R on the supporting substrate 102.

Figure 5E:
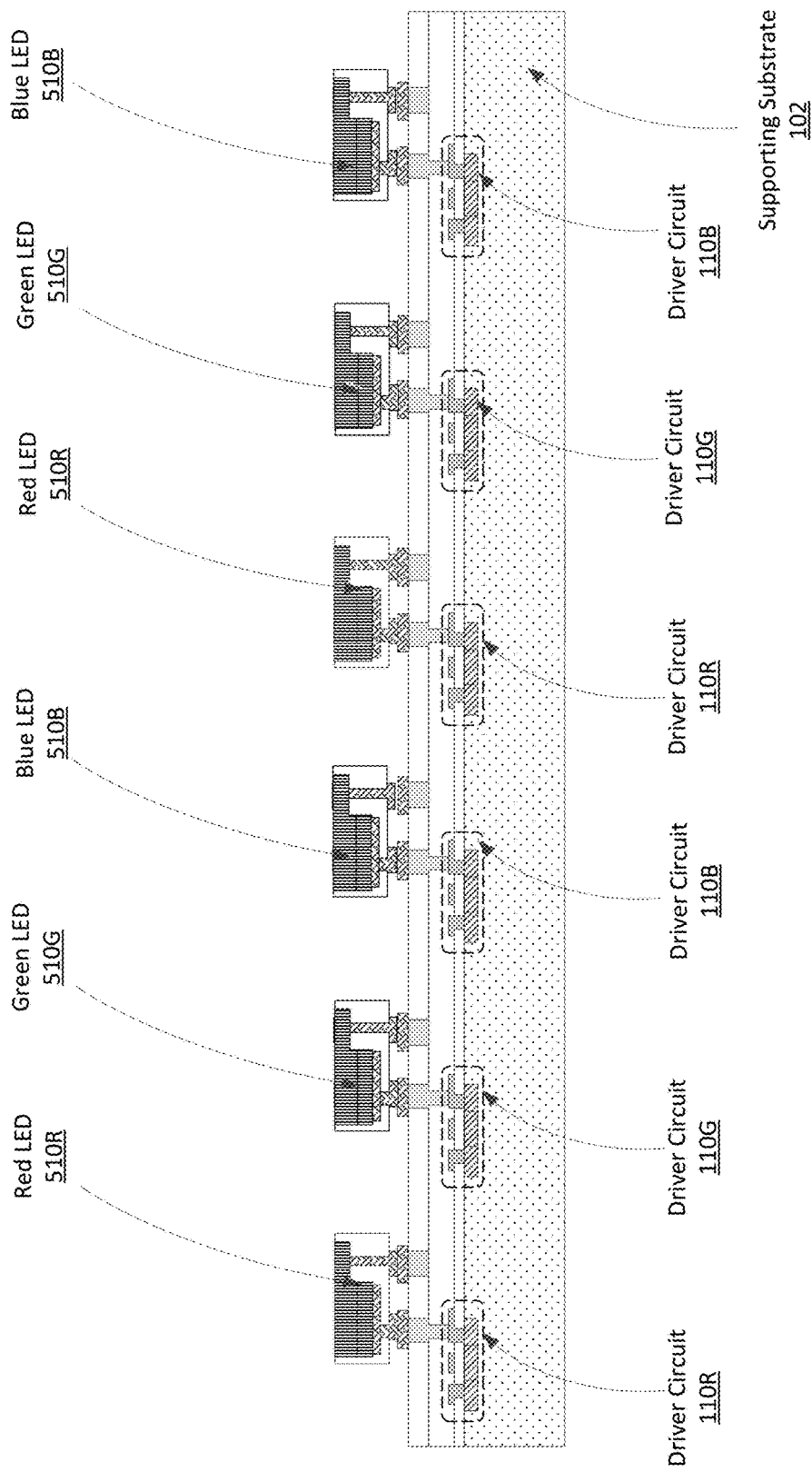

This process can be repeated with additional LED wafers. FIG. 5E is a cross-sectional view of a full-color display panel with arrays of red, green and blue LEDs bonded to the driver circuitry 110 on the supporting substrate 102, according to one embodiment. In FIG. 5E, the display panel is fabricated via multi-stage alignment bonding and substrate removal. During each stage, an LED wafer with different color LEDs is bonded to the corresponding driver circuitry 110. The substrates of the LED wafers are removed between bonding stages. The substrate for the last stage may or may not be removed.

Although the detailed description contains many specifics, these should not be construed as limiting the scope of the invention but merely as illustrating different examples and aspects of the invention. It should be appreciated that the scope of the invention includes other embodiments not discussed in detail above. For example, the approaches described above can be applied to the integration of functional devices other than LEDs with control circuitry other than pixel drivers. Examples of non-LED devices include vertical cavity surface emitting lasers (VCSEL), photodetectors, micro-electro-mechanical system (MEMS), silicon photonic devices, power electronic devices, and distributed feedback lasers (DFB). Examples of other control circuitry include current drivers, voltage drivers, transimpedence amplifiers, and logic circuits.

Various other modifications, changes and variations which will be apparent to those skilled in the art may be made in the arrangement, operation and details of the method and apparatus of the present invention disclosed herein without departing from the spirit and scope of the invention as defined in the appended claims. Therefore, the scope of the invention should be determined by the appended claims and their legal equivalents.

What is claimed is:

1. A method for fabricating an integrated LED display comprising:
   fabricating a CMOS wafer comprising driver circuitry fabricated on a supporting substrate, the driver circuitry including an array of pixel drivers;
   for each of two or more LED wafers, each LED wafer comprising an array of LEDs fabricated on a substrate, each LED having a first LED contact, wherein the two or more LED wafers comprise an LED wafer with red LEDs, an LED wafer with green LEDs and an LED wafer with blue LEDs:

bonding the LED wafer to the CMOS wafer, comprising aligning and bonding the first LED contacts to contacts for corresponding pixel drivers on the CMOS wafer; and for all LED wafers except a last LED wafer, removing the substrate for the LED wafer before bonding the next LED wafer.

2. The method of claim 1, wherein the integrated LED display is a multi-color LED display.

3. The method of claim 1, wherein the integrated LED display is an RGB LED display; and the two or more LED wafers comprise a first LED wafer with LEDs used to produce red color pixels, a second LED wafer with LEDs used to produce green color pixels, and a third LED wafer with LEDs used to produce blue color pixels.

4. The method of claim 1, wherein the substrates for the LED wafers are a different material than the supporting substrate.

5. The method of claim 1, wherein the pixel drivers include driving transistors that drive the corresponding LEDs, and bonding the first LED contacts to contacts for corresponding pixel drivers on the CMOS wafer comprises bonding the first LED contacts to contacts for sources/drains of the driving transistors for the corresponding pixel drivers.

6. The method of claim 1, wherein each LED has a second LED contact and bonding the LED wafer to the CMOS wafer further comprises bonding the second LED contacts to corresponding contacts on the CMOS wafer simultaneously with bonding the first LED contacts.

7. The method of claim 1, wherein each LED has a second LED contact and the method further comprises:
after bonding of LED wafers to the CMOS wafer, making connections from the second LED contacts to corresponding contacts on the CMOS wafer.

8. The method of claim 1, wherein removing the substrate for the LED wafer comprises removing the substrate via wet chemical etching.

9. The method of claim 1, wherein removing the substrate for the LED wafer comprises removing the substrate via a laser lift off process.

10. The method of claim 1, further comprising:
removing the substrate for the last LED wafer.

11. The method of claim 1, wherein the substrate for the last LED wafer is not removed.

12. The method of claim 11, wherein the substrate for the last LED wafer is transparent.

13. The method of claim 1, further comprising:
after bonding of all LED wafers to the CMOS wafer, depositing a dielectric layer between the LEDs to electrically isolate the LEDs.

14. The method of claim 13, further comprising:
planarizing the dielectric layer.

15. The method of claim 1, wherein the pixel drivers comprise thin-film transistor pixel drivers.

16. The method of claim 1, wherein the LED wafers are bonded to the CMOS wafer in the following order: first the red LED wafer, then the green LED wafer, and then the blue LED wafer.

* * * * *